United States Patent
Wu et al.

(10) Patent No.: US 6,476,433 B1
(45) Date of Patent: Nov. 5, 2002

(54) SEMICONDUCTOR INTERCONNECTION STRUCTURE AND METHOD

(75) Inventors: Jeff Wu, Plano, TX (US); Randhir P. S. Thakur, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 09/655,934

(22) Filed: Sep. 6, 2000

Related U.S. Application Data (62) Division of application No. 09/071,860, filed on May 4, 1998, now Pat. No. 6,172,387.

(51) Int. Cl.[7] .............................................. H01L 27/108
(52) U.S. Cl. ........................ 257/298; 257/296; 257/306; 438/238; 438/386; 438/244; 438/396
(58) Field of Search .................................. 257/296, 306, 257/298; 438/238, 239, 386, 399, 244, 253, 387, 396

(56) References Cited

U.S. PATENT DOCUMENTS

| | | | | |
|---|---|---|---|---|
| 5,399,890 A | * | 3/1995 | Okada et al. ................ | 257/306 |
| 5,436,477 A | * | 7/1995 | Hashizume et al. ........ | 257/310 |
| 5,903,492 A | | 5/1999 | Takashima ................... | 365/145 |
| 5,976,929 A | * | 11/1999 | Kajigaya et al. ............ | 438/241 |

OTHER PUBLICATIONS

Wolf, Silicon Processing for the VLSI Era, 1990, Lattice Press, vol. 2, p. 195.*

* cited by examiner

Primary Examiner—Nathan J. Flynn
Assistant Examiner—Scott R. Wilson
(74) Attorney, Agent, or Firm—Dickstein Shapiro Morin & Oshinsky LLP

(57) ABSTRACT

A memory device and method in which the capacitor lower electrode within the memory cell array and a first interconnection layer within the peripheral circuitry are provided simultaneously from the same conductive material. The capacitor upper electrode and a second interconnection layer within the peripheral circuitry are also provided simultaneously from the same conductive material.

17 Claims, 13 Drawing Sheets

SEMICONDUCTOR INTERCONNECTION STRUCTURE AND METHOD

This application is a divisional application of application Ser. No. 09/071,860 filed on May 4, 1998, now U.S. Pat. No. 6,172,387, which is hereby incorporated by reference.

FIELD OF THE INVENTION

The invention relates generally to integrated circuits and more particularly to the fabrication of interconnection layers for memory cell arrays and peripheral circuitry.

BACKGROUND OF THE INVENTION

Semiconductor memory systems are comprised of two basic elements: memory storage areas and memory control areas. DRAM (dynamic random access memory), for example, includes a memory cell array, which stores information, and peripheral circuitry, which controls the operation of the memory cell array.

Interconnecting memory cell arrays and peripheral circuitry is of special concern in DRAM memory circuits; therefore, the invention will be discussed in connection with DRAM memory circuits. However, the invention has broader applicability and is not limited to DRAM memory circuits. It may be used in any other type of memory circuit, such as SRAM (static random access memory), in which memory storage areas and memory control areas are interconnected.

Figure 1:
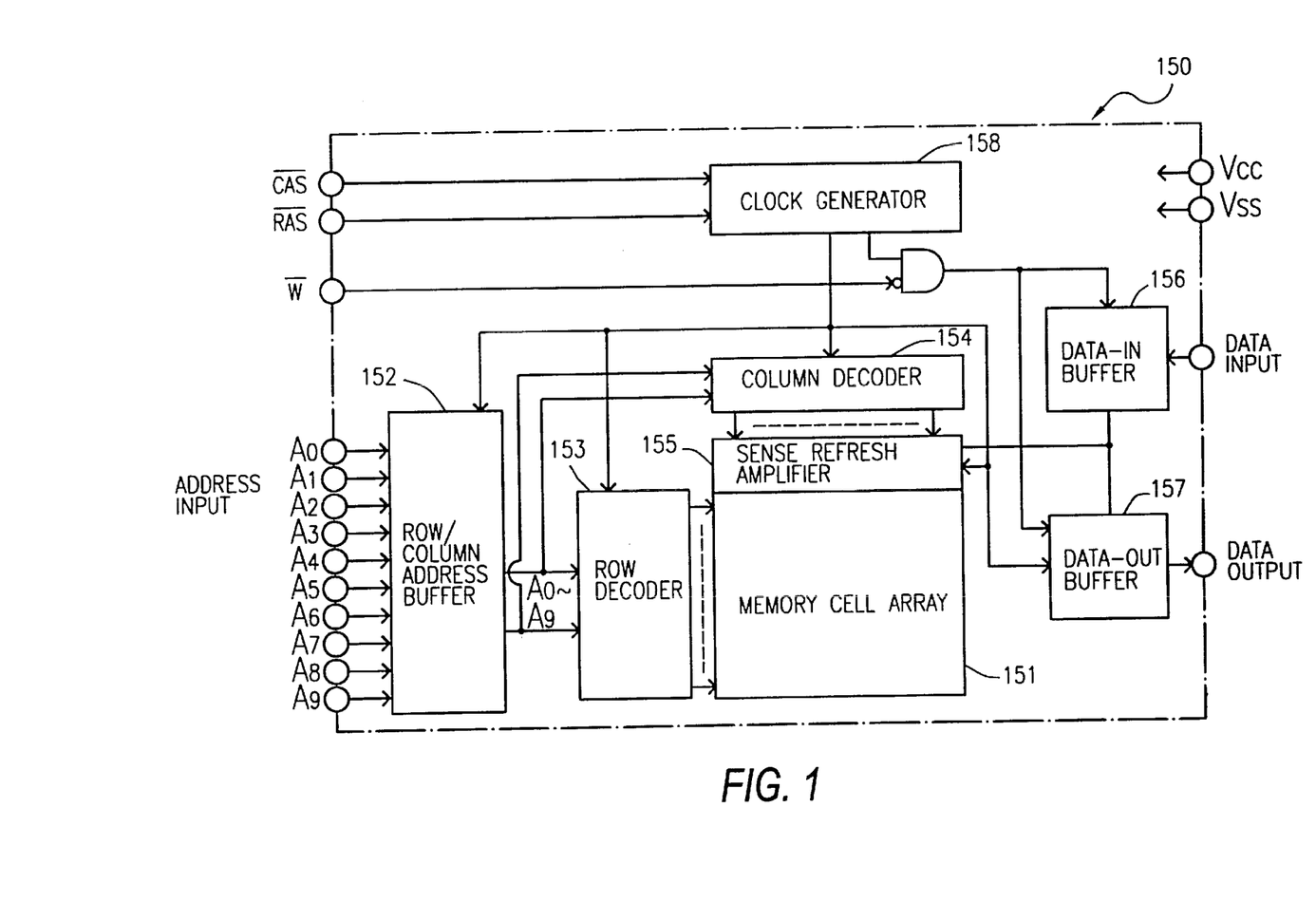
FIG. 1 is a block diagram showing a general structure of a DRAM.

FIG. 1 is a block diagram of a DRAM. Referring to FIG. 1, DRAM 50 comprises: a memory cell array 51 for storing data signals of memory information; a row and column address buffer 52 for receiving external address signals for selecting a memory cell (constituting a unit memory circuit); a row decoder 53 and a column decoder 54 for designating the memory cell by decoding the address signals; a sense refresh amplifier 55 for amplifying and reading a signal stored in the designated memory cell; a data in buffer 56 and a data out buffer 57 for inputting/outputting data; and a clock generator 58 for generating a clock signal.

The peripheral circuitry communicates with and controls the storage operations of the memory cell array through interconnection layers (or interconnects) usually formed from aluminum or other metal. Typically, five or more metal interconnection layers are used. The fabrication of each metal interconnection layer typically requires several processing steps, including the deposition of an insulating layer, the formation of contacts, and the deposition of the interconnection material. Each of these processing steps in turn typically requires several masking and etching steps.

Because the formation of metal interconnection layers is complex and expensive, there is presently a need for structures and methods which reduce the overall number of metal interconnection layers required in the formation of semiconductor memory devices.

SUMMARY OF THE INVENTION

A semiconductor memory device in accordance with the invention includes a memory cell array having a plurality of memory cells each formed of at least one MOS transistor and at least one capacitor. Further, the memory device includes a peripheral circuit for writing/reading prescribed information to and from the memory cell region. The present invention reduces the number of steps necessary to manufacture semiconductor memory devices by providing a semiconductor structure and method in which the capacitor upper and lower electrode layers of the memory cell array are deposited within the peripheral circuitry as the first and second interconnection layers of the peripheral circuitry.

In accordance with the preferred embodiment of the invention, the first and second electrode layers are preferably deposited simultaneously within the memory cell array and the peripheral circuitry. Further in accordance with the preferred embodiment of the invention, the first and second electrode layers are preferably formed of the same material. Thus, the number of material layers, mask count and process steps required for memory fabrication are reduced.

These and other aspects, features and advantages of the invention will become apparent from the following detailed description of preferred embodiments of the present invention.

BRIEF DESCRIPTION OF THE DRAWINGS

FIG. 2A is a cross-sectional view of a fragment of a memory cell array during a first step in the DRAM fabrication, while

FIG. 3A is a cross-sectional view of a fragment of a memory cell array during a second step in the DRAM fabrication, while

FIG. 4A is a cross-sectional view of a fragment of a memory cell array during a third step in the DRAM fabrication, while

FIG. 5A is a cross-sectional view of a fragment of a memory cell array during a fourth step in the DRAM fabrication, while

FIG. 6A is a cross-sectional view of a fragment of a memory cell array during a fifth step in the DRAM fabrication, while

FIG. 7A is a cross-sectional view of a fragment of a memory cell array during a sixth step in the DRAM fabrication, while

FIG. 8A is a cross-sectional view of a fragment of a memory cell array during a seventh step in the DRAM fabrication, while

FIG. 9A is a cross-sectional view of a fragment of a memory cell array during a eighth step in the DRAM fabrication, while

FIG. 10A is a cross-sectional view of a fragment of a memory cell array during a ninth step in the DRAM fabrication, while

FIG. 11A is a cross-sectional view of a fragment of a memory cell array during a tenth step in the DRAM fabrication, while

FIG. 12A is a cross-sectional view of a fragment of a memory cell array during an eleventh step in the DRAM fabrication, while

FIG. 13A is a cross-sectional view of a fragment of a memory cell array in accordance with the preferred embodiment of the present invention, while

DETAILED DESCRIPTION OF THE PREFERRED EMBODIMENTS

An exemplary construction according to one embodiment of the present invention is described below. It is to be understood, however, that this semiconductor structure and fabrication process is only one example of many possible structures and processes for practice of the present invention. For example, borophosphosilicate glass (BPSG) is used in the preferred embodiment to insulate between conductive layers. Other insulating material can also be used such as phosphosilicate glass (PSG) or silicon dioxide ($SiO_2$). As another example, planar capacitors are used in the following structure and process for practice of the invention. Trench or stacked capacitors (including container capacitors) could also be used. Also, dry or wet etching could be used rather than chemical mechanical polishing. The invention is not intended to be limited by the particular structure or process described below.

Further, the present invention can be used in any area of semiconductor or electronics fabrication where interconnects are desired between memory storage areas and logic or control circuitry. Accordingly, the present invention is applicable to all areas of memory and memory access technology including RAM (e.g., DRAM, SRAM, SCRAM, EDRAM, VDRAM, NVSRAM, NVDRAM, DPSRAM, PSDRAM) and ROM (e.g., EPROM, EEPROM, EAROM) technologies.

Figure 13A:
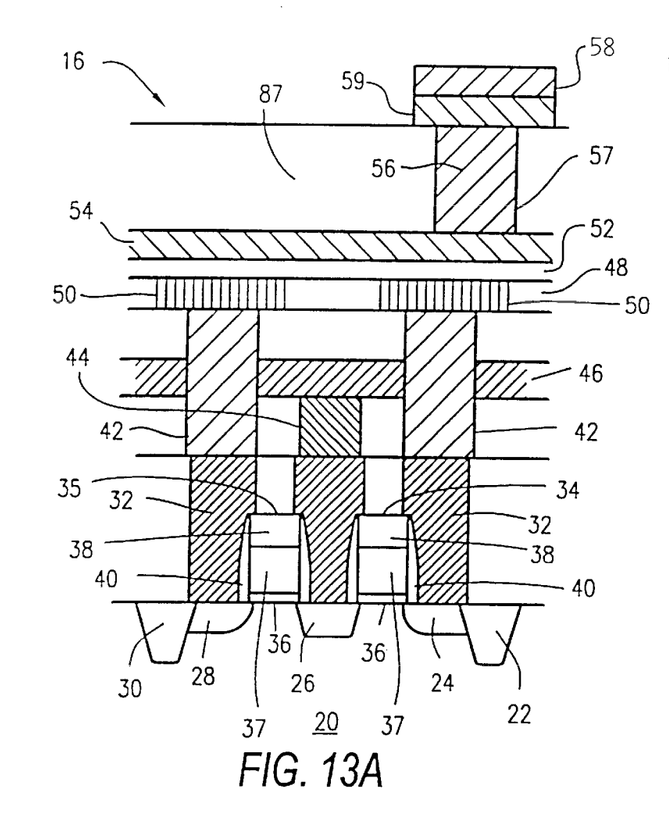
Figure 13B:
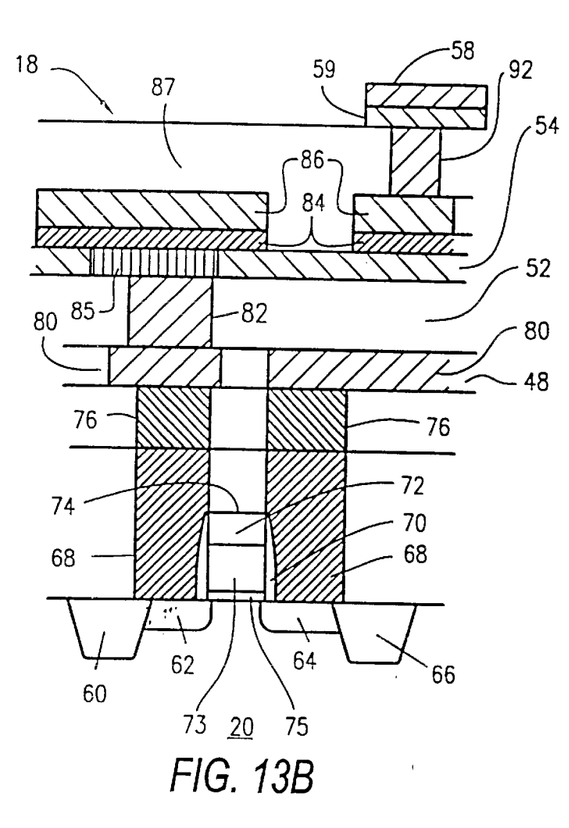
FIG. 13B is a cross-sectional view of a portion of the peripheral circuitry in accordance with the preferred embodiment of the present invention.

Referring to FIGS. 13A and 13B, an illustrative structure of a DRAM is shown which includes a memory cell array 16 and peripheral circuitry 18. Referring to FIG. 13A, in the memory cell array 16, a p-type semiconductor substrate 20 has isolating regions 22, 30 between which are formed source regions 24, 28 and drain region 26. Word lines 34, 35 have been constructed on the p-type semiconductor substrate 20 in a conventional manner as will be described in detail below. Each word line 34, 35 consists of a lower gate oxide 36, a poly layer 37, an insulating silicon nitride cap 38, and silicon nitride spacers 40.

Upper plug electrodes 42 are formed above active areas 24, 28. Lower plug electrodes 32 are formed above the active areas 24, 26, 28. Bit line contact 44 is formed above active area 26 and in contact with bit line 46. Capacitor lower electrodes 50 are formed within a first conductive layer 48 (lower electrode layer). Lower electrodes 50 are covered with a dielectric film 52, preferably formed of cell dielectric materials such as tantalum pentoxide $Ta_2O_5$, strontium titanate $SrTiO_3$ ("ST"), barium strontium titanate (Ba, Sr)$TiO_3$ ("BST"), lead zircon titanate Pb(Z,Ti)$O_3$ ("PZT"), strontium bismuth tantalate $SrBi_2Ta_2O_9$ ("SBT") or barium zirconate titanate Ba(Zr,Ti)$O_3$ ("BZT"). According to the preferred embodiment, the capacitor lower electrodes 50 in the memory cell array are covered with a high K dielectric material in order to maximize capacitance. A second conductive layer 54 (upper electrode layer) is then deposited over the dielectric layer 52. This second conductive layer 54 is preferably formed of the same material as the first conductive layer 48.

The second conductive layer 54 is then covered with a protective layer of undoped oxide 87 of a thickness preferably greater than 2000 angstroms. The second conductive layer 54 is connected to metal layer 58 through, for example, polysilicon contact 56 and barrier metal layer 59.

Now, the preferred structure of the peripheral circuitry 18 will be described with reference to FIG. 13B. In the peripheral circuitry 18, p-type semiconductor substrate 20 has isolating regions 60, 66 between which are formed source region 62 and drain region 64. A word line 74 has been constructed in a conventional manner. The word line consists of a lower gate oxide 75, a lower poly layer 73, and an insulating silicon nitride cap 72. Each word line is also provided with insulating spacers 70, preferably of silicon nitride. Upper electrode plugs 76 and lower electrode plugs 68 are formed above the active areas 62, 64. Interconnection layer 80 (first conductive layer) is formed above the upper electrode plug 76. Plug electrode 82 is formed above interconnection layer 80. Contact 85 is formed within interconnection layer 54 and a barrier metal layer 84 is preferably deposited between contact 85 and first metal interconnection layer 86. The first metal interconnection layer 86 is covered with a protective layer of undoped oxide 87 of a thickness preferably greater than 2000 angstroms. A second metal interconnection layer 58 is connected to the first metal layer through plug electrode 92 and barrier metal layer 59.

Accordingly, as described above, the semiconductor device includes a first conductive layer 48 which serves as a lower electrode layer for capacitors within the memory cell array 16 and as a first interconnection layer 80 within the peripheral circuitry 18. In addition, the preferred semiconductor device further comprises a second conductive layer 54 which serves as an upper electrode layer for capacitors within the memory cell array 16 and as a second interconnection layer within the peripheral circuitry 18. Accordingly, additional metal or other interconnection layers are not needed to form the first two layers of interconnects.

Referring to FIGS. 2A and 2B to 13A and 13B, a method of manufacturing the DRAM of the preferred embodiment will be described below.

Figure 2A:
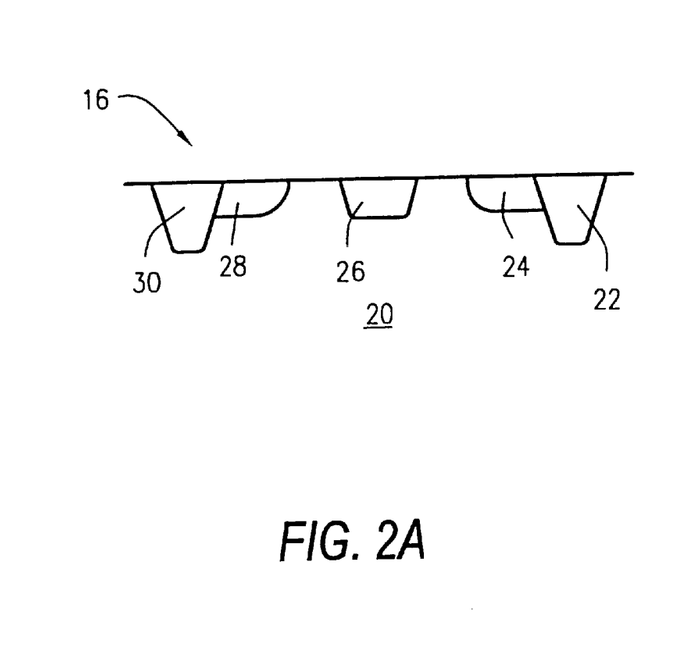
Figure 2B:
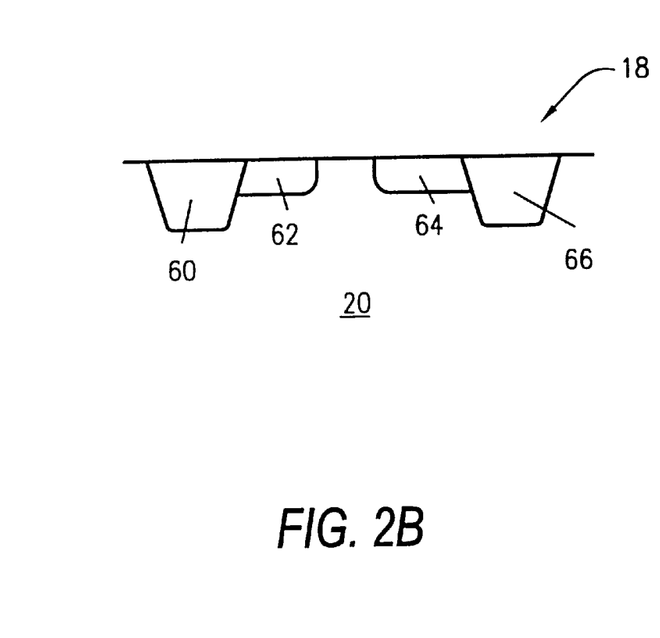
FIG. 2B is a cross-sectional view of a portion of the peripheral circuitry during a first step in the DRAM fabrication.

Referring to FIGS. 2A and 2B, source regions 24, 28 and drain region 26 are formed in the memory cell array 16 using a doping technique such as ion implantation, diffusion or the like. The source regions 24, 28 and drain region 26 are then isolated using Shallow Trench Isolation (STI) to form isolating regions 22, 30. Source region 62, drain region 64 and isolating regions 60, 66 in the peripheral circuitry 18 are similarly formed using STI.

Figure 3A:
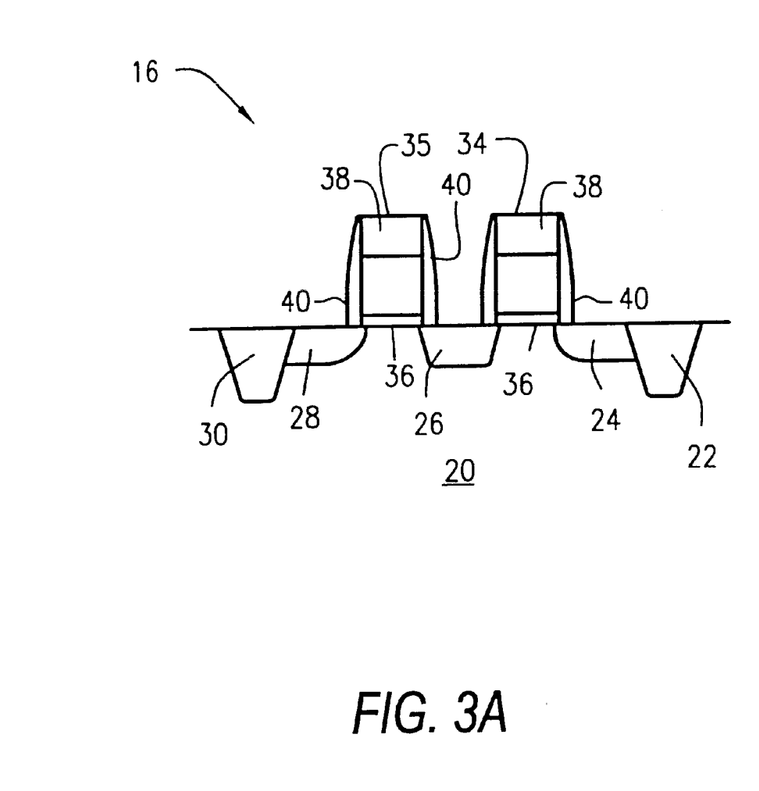

Referring to FIG. 3A, two FETs (Field Effect Transistors) are depicted in the memory array area. One FET is comprised of two active areas (source/drain) 26, 24 and one word line (gate) 34. The second FET is comprised of two active areas (source/drain) 26, 28 and a second word line (gate) 35. The active area 26 common to both FETs is the active area over which a bit line contact will be formed.

Figure 3B:
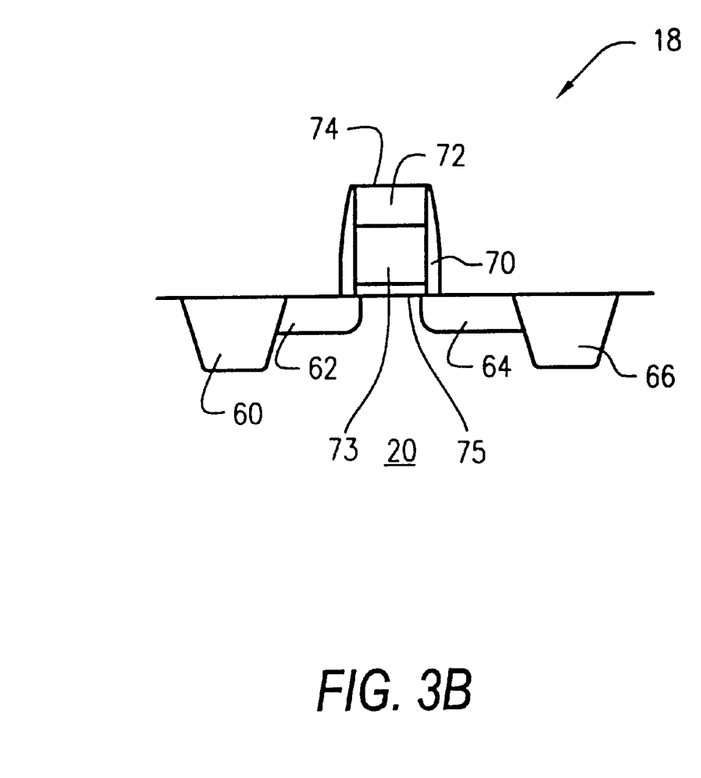
FIG. 3B is a cross-sectional view of a portion of the peripheral circuitry during a second step in the DRAM fabrication.

Referring to FIG. 3B, a single FET is depicted in the peripheral circuit area. This FET is comprised of two active areas (source/drain) 64, 62 and one word line (gate) 74.

Figure 4A:
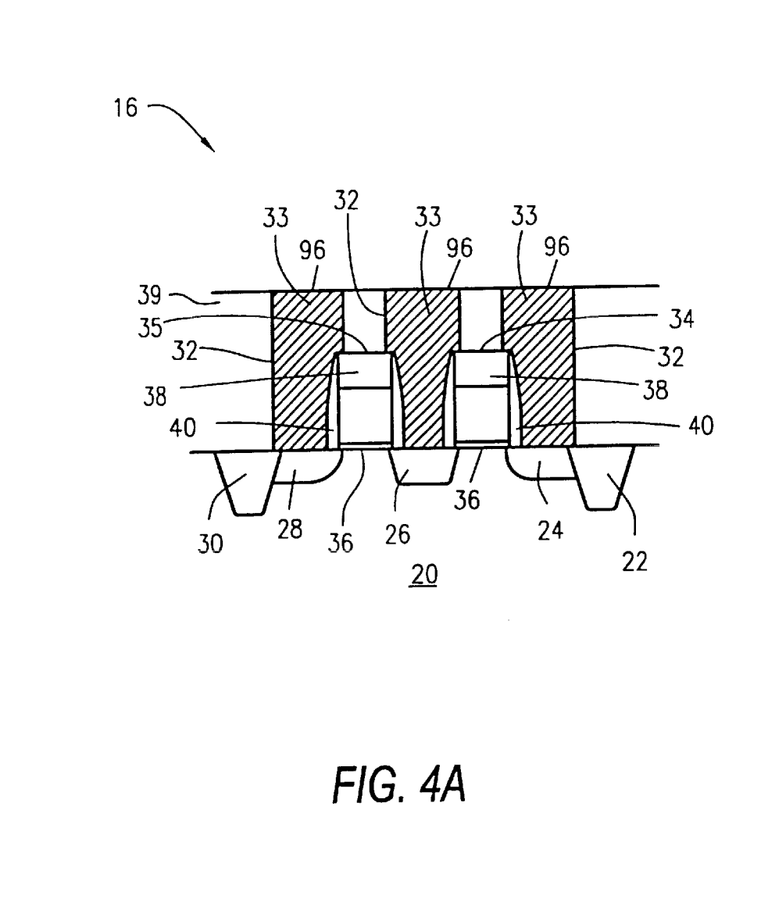
Figure 4B:
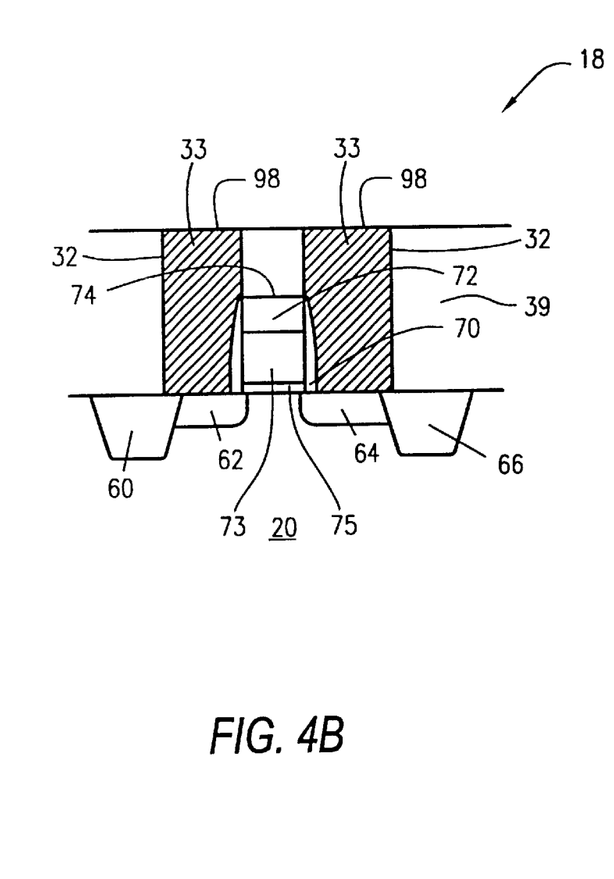
FIG. 4B is a cross-sectional view of a portion of the peripheral circuitry during a third step in the DRAM fabrication.

Referring now to FIGS. 4A and 4B, a layer of insulating material 39 is deposited. The insulating material preferably consists of borophosphosilicate glass (BPSG). The insulating layer 39 is subsequently planarized by chemical-mechanical polishing (CMP). Plug openings 96, 98 are formed through the insulating layer 39 by photomasking and dry chemical or other suitable etching. A layer of conductive material 33 is deposited to provide conductive material within the plug openings 96, 98. Within the memory cell array 16, the conductive layer 33 is in contact with the active areas 24, 26, 28. Within the peripheral circuitry 18, the conductive layer 33 is in contact with the active areas 62, 64. An example of the material used to form the conductive layer 33 is doped polysilicon. Once deposited, the conductive layer 33 is dry etched (or chemical-mechanical polished) to a point just below the upper surface of the BPSG layer 39 such that the remaining material of the conductive layer 33 forms electrically isolated plugs 32 over the active areas 24, 26, 28 (within the memory cell array 16) and 62, 64 (within the peripheral circuitry 18).

Figure 5A:
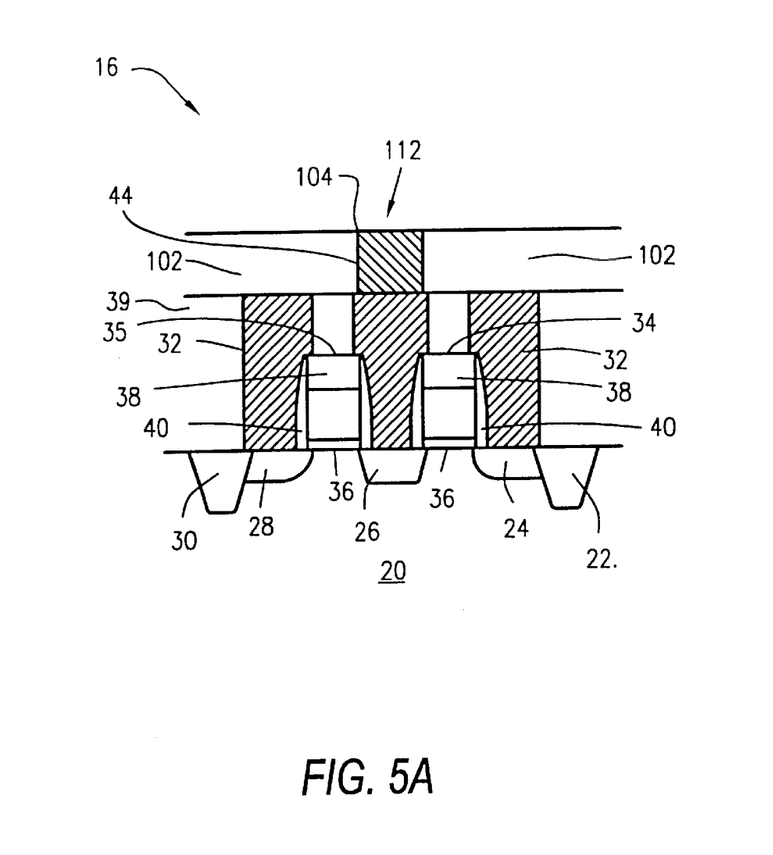
Figure 5B:
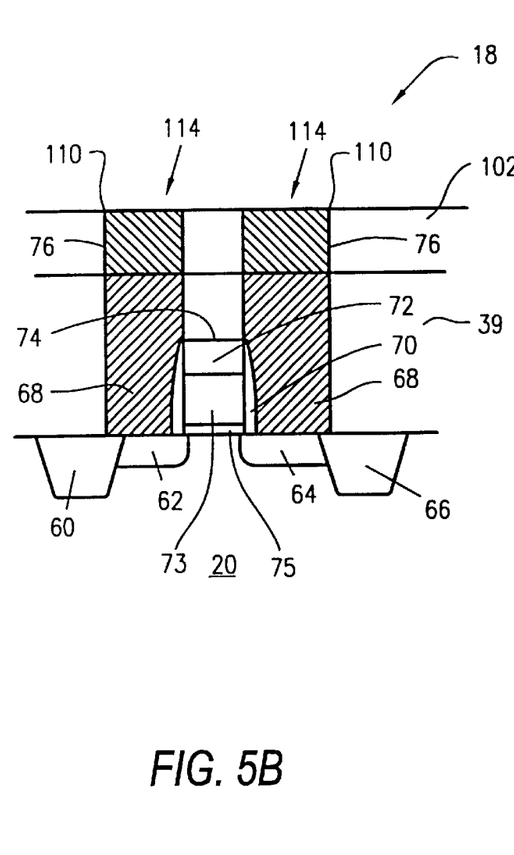
FIG. 5B is a cross-sectional view of a portion of the peripheral circuitry during a fourth step in the DRAM fabrication.

Referring now to FIGS. 5A and 5B, an insulating layer 102 of, for example, BPSG is deposited on the electrically isolated plugs 32. Bit line contact opening 104 and plug openings 110 are then formed in the BPSG layer 102 by photomasking and dry chemical or other suitable etching.

Referring to FIG. 5A, a layer 112 of conductive material is deposited within the bit line contact opening 104 to form bit line contact 44. Referring to FIG. 5B, a layer 114 of conductive material is deposited within the plug openings 110 to form upper plug electrodes 76.

Figure 6A:
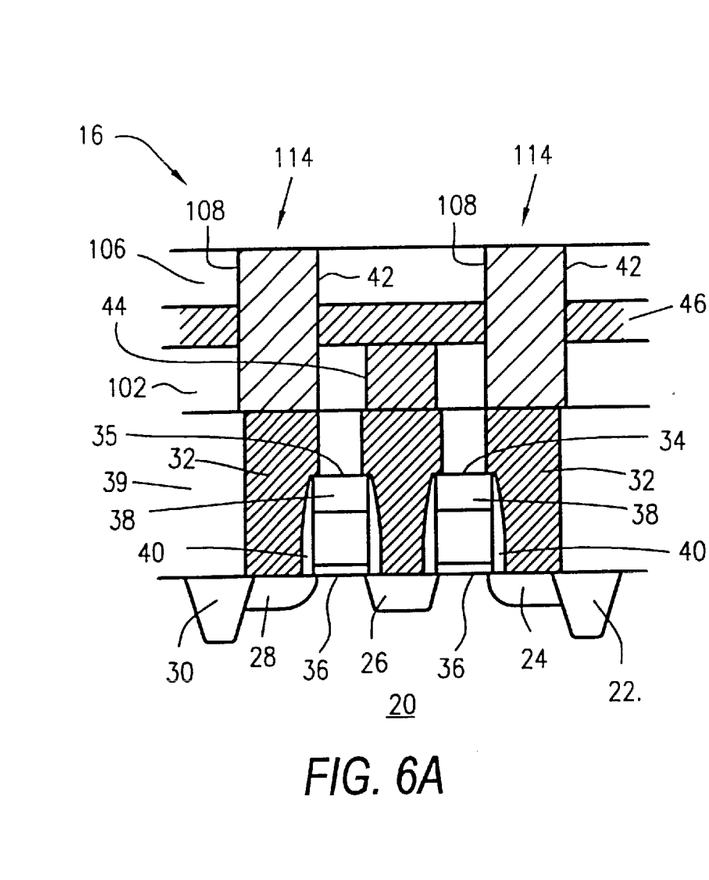
Figure 6B:
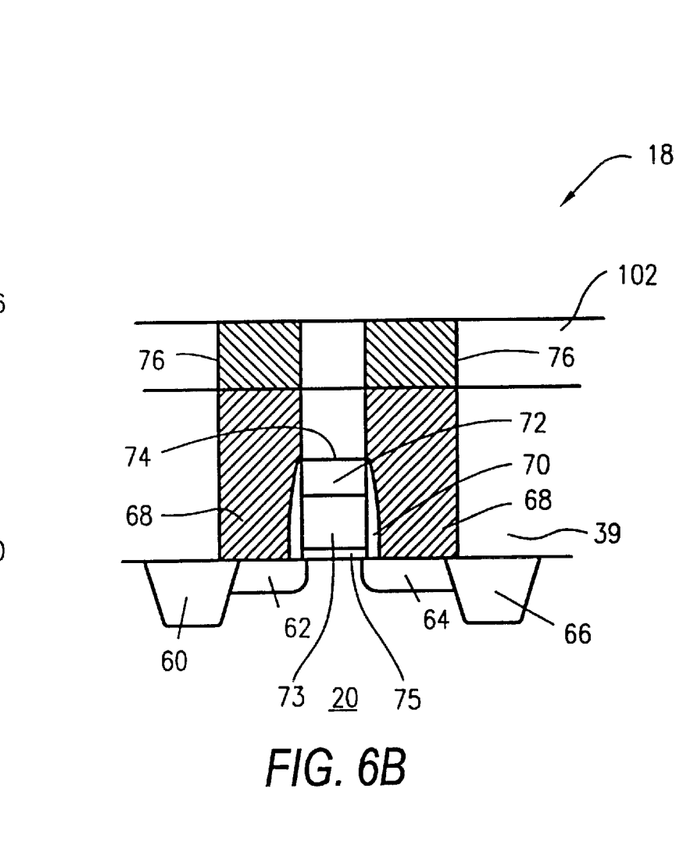
FIG. 6B is a cross-sectional view of a portion of the peripheral circuitry during a fifth step in the DRAM fabrication.

Referring to FIG. 6A, a bit line 46 is deposited over BPSG layer 102 and bit line contact 44. Insulation layer 106 of BPSG is deposited over the bit line 46. Plug openings 108 have been formed through the insulating layer 106, bit line 46, and insulating layer 102. The plug openings 108 are formed by photomasking and dry chemical etching, for example, of the BPSG and buried bit line 46. A layer of conductive material 114 is deposited to provide conductive material within the plug openings 108. An example of the material used to form layer 114 is doped polysilicon. Once deposited, the conductive layer 114 is, for example, dry etched or chemical-mechanical polished to a point just below the upper surface of the BPSG layer 106 such that the remaining material of the conductive layer 114 forms electrically isolated plugs 42.

Figure 7A:
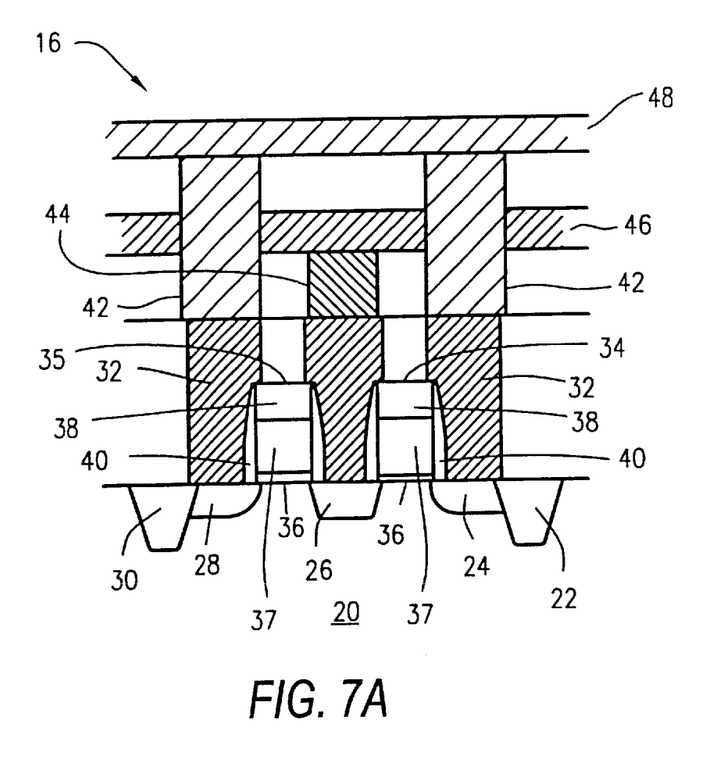
Figure 7B:
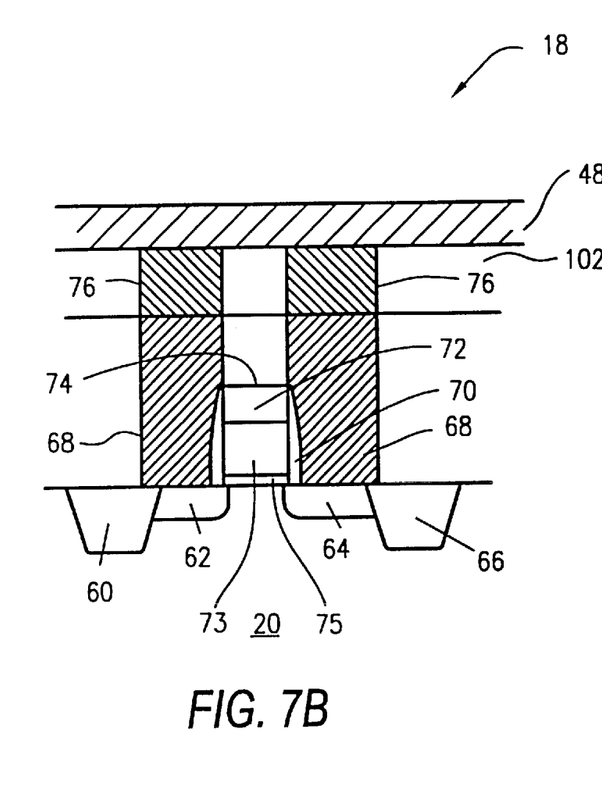
FIG. 7B is a cross-sectional view of a portion of the peripheral circuitry during a sixth step in the DRAM fabrication.

Referring to FIGS. 7A and 7B, sputtering or the like is used to deposit a first conductive layer 48. According to the preferred embodiment, the first conductive layer 48 is formed of a conductive metal or metal oxide (such as Ru, Ir, ruthenium oxide ($RuO_2$), iridium oxide ($IrO_2$), platinum silicide ($PtSi_2$), Pt or W). In alternative embodiments, the first conductive layer 48 may be formed of materials such as W, tungsten sillicide ($WSi_2$), Al, aluminum oxide ($Al_2O_3$), Ti or titanium nitride (TiN).

Figure 8A:
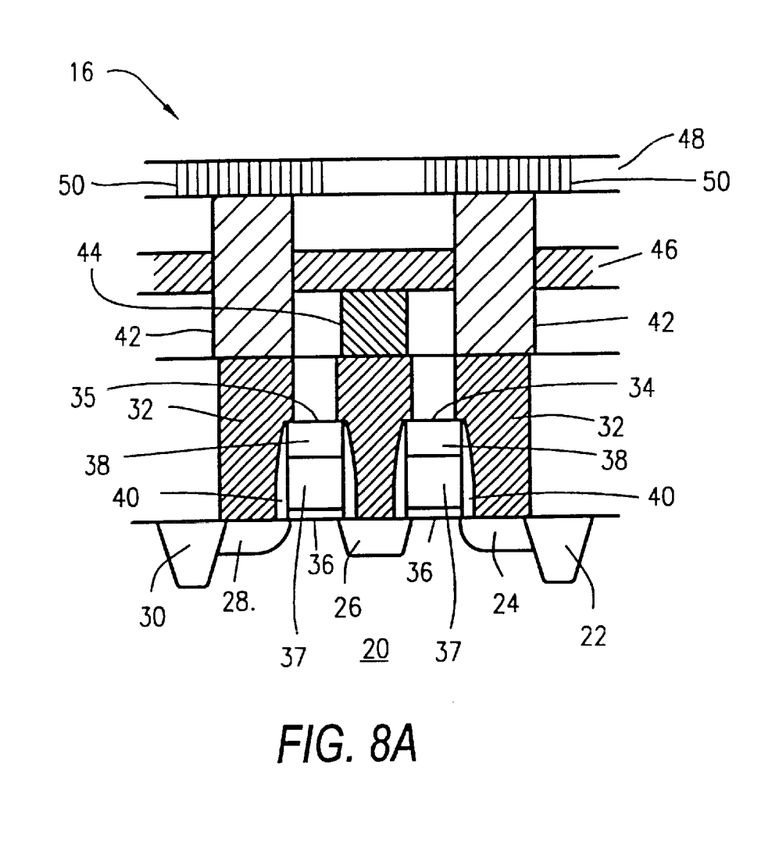
Figure 8B:
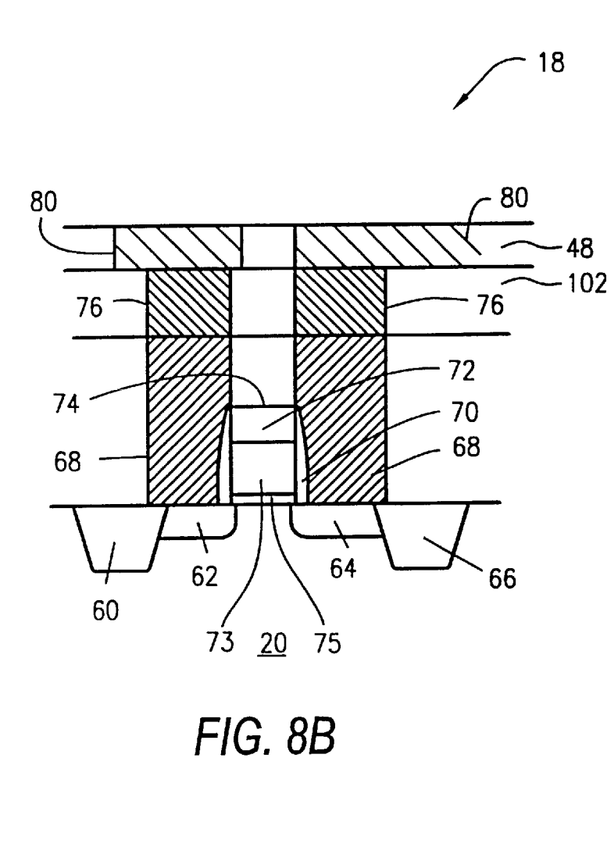
FIG. 8B is a cross-sectional view of a portion of the peripheral circuitry during a seventh step in the DRAM fabrication.

Referring to FIG. 8A, within the memory cell array 16, the first conductive layer 48 (lower electrode layer) is patterned into capacitor lower electrodes 50. Referring to FIG. 8B, within the peripheral circuitry 18, the first conductive layer 48 is patterned as an interconnection layer 80.

Figure 9A:
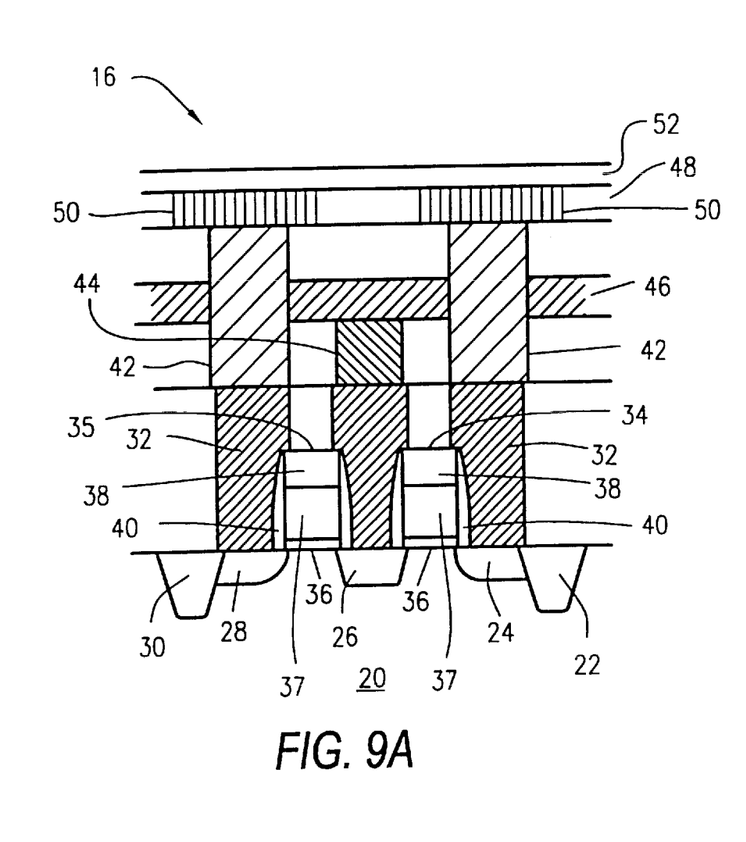
Figure 9B:
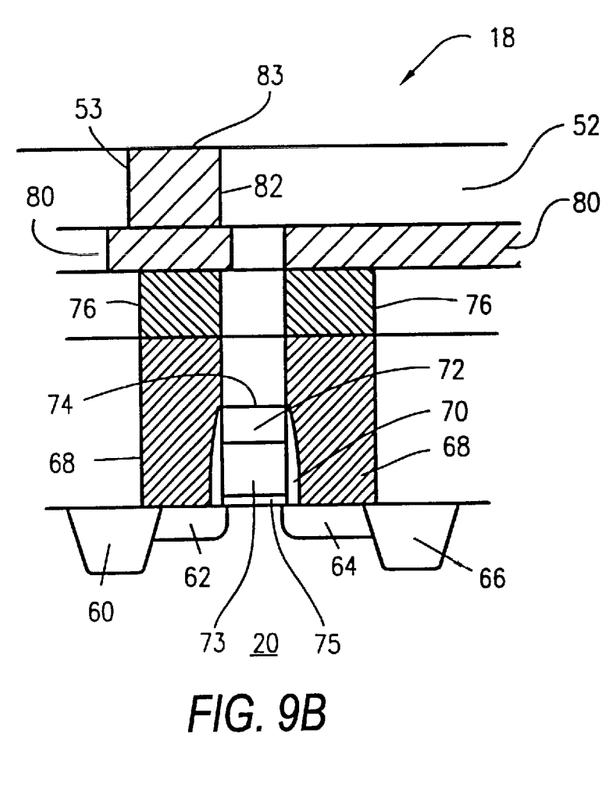
FIG. 9B is a cross-sectional view of a portion of the peripheral circuitry during an eighth step in the DRAM fabrication.

Referring to FIGS. 9A and 9B, the patterned capacitor lower electrodes 50 and interconnection layer 80 are covered with a dielectric film 52 such as ST, BST, PZT, SBT, $TaO_5$, $TiO_2$, or $T_2O_3$. According to the preferred embodiment, the capacitor lower electrodes 50 in the memory cell array 16 are covered with a high K dielectric material in order to maximize capacitance, and the interconnection layer 80 in the peripheral circuit 18 is covered with a relatively low K dielectric material. For the purposes of the present invention, high K dielectrics are considered dielectric materials with dielectric constants greater than or equal to 2; low K dielectrics are considered dielectric materials with dielectric constants less than or equal to 2.

Referring now to FIG. 9B, plug opening 53 has been formed through the dielectric layer 52. The plug opening 53 is formed by photomasking and dry chemical etching, for example, the dielectric material. A layer of conductive material 83 is deposited to provide conductive material within plug opening 53. An example of the material used to form layer 83 is doped polysilicon. Once deposited, the conductive layer 83 is, for example, dry etched or chemical-mechanical polished to a point just below the upper surface of the dielectric layer 52 such that the remaining material of the conductive layer 83 forms electrically isolated plug 82.

Figure 10A:
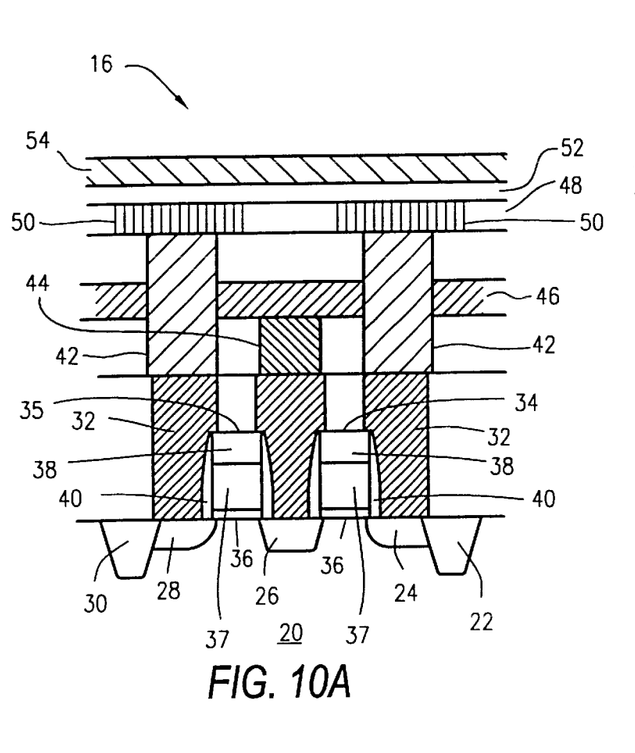
Figure 10B:
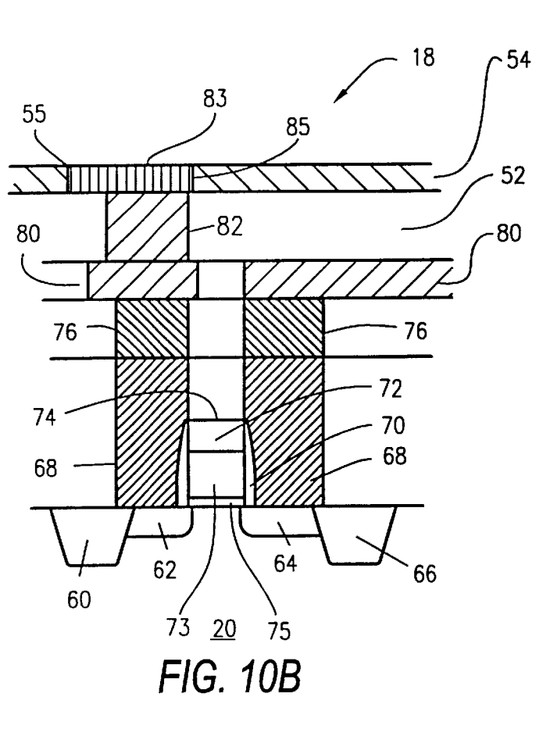
FIG. 10B is a cross-sectional view of a portion of the peripheral circuitry during a ninth step in the DRAM fabrication.

Referring to FIGS. 10A and 10B, the dielectric film 52 is covered with a second conductive layer 54. The second conductive layer 54 may deposited by a sputtering method or the like. The second conductive layer 54 is preferably formed of the same material as the first conductive layer 48.

Referring now to FIG. 10B, a contact opening 55 is formed by photomasking and etching of the second conductive layer 54. A layer of conductive material 83 is then deposited to provide conductive material within the contact opening 55 and form contact 85. Contact 85 may be formed of a refractory metal silicide, such as molybdenum or tungsten silicide. The second conductive layer 54 is subsequently planarized by, for example, chemical-mechanical polishing (CMP).

Figure 11A:
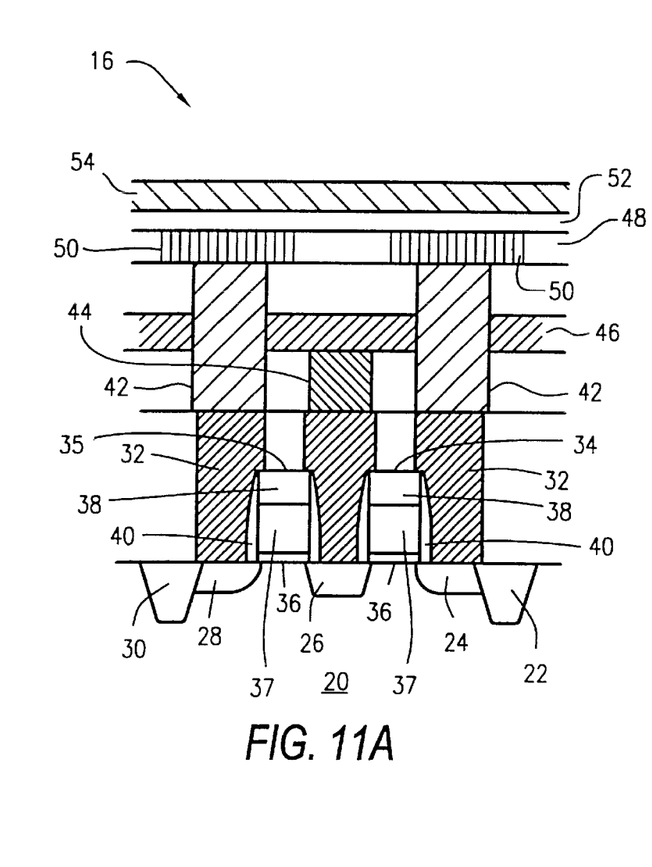
Figure 11B:
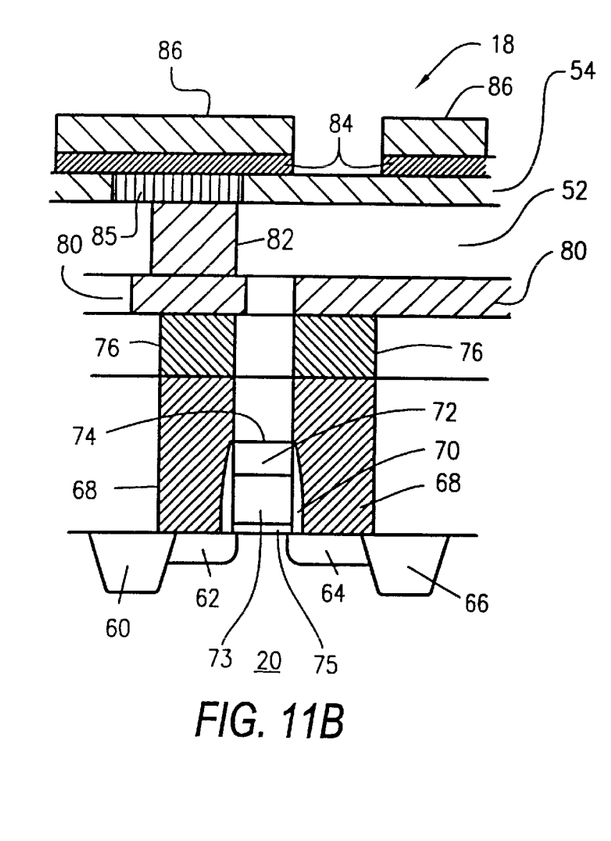
FIG. 11B is a cross-sectional view of a portion of the peripheral circuitry during a tenth step in the DRAM fabrication.

Referring now to FIG. 11B, a barrier metal layer 84 is preferably deposited to minimize metal-oxide interaction between the second conductive layer 54 and subsequently deposited metal layers. A metal such as aluminum is then deposited and etched to form a first metal interconnection layer 86. The metal is deposited by sputtering or the like.

Figure 12A:
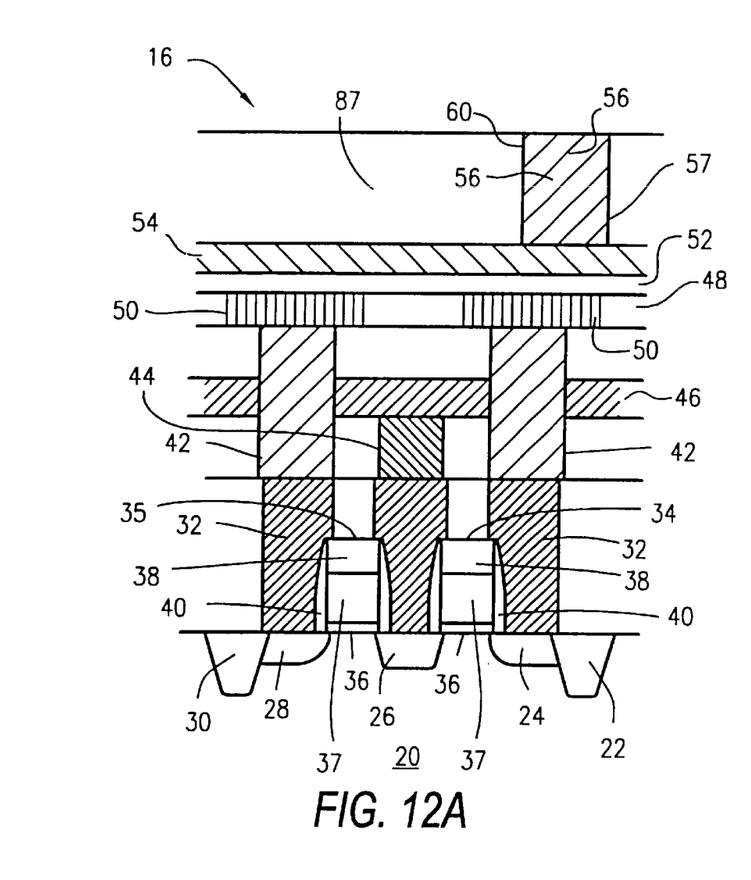
Figure 12B:
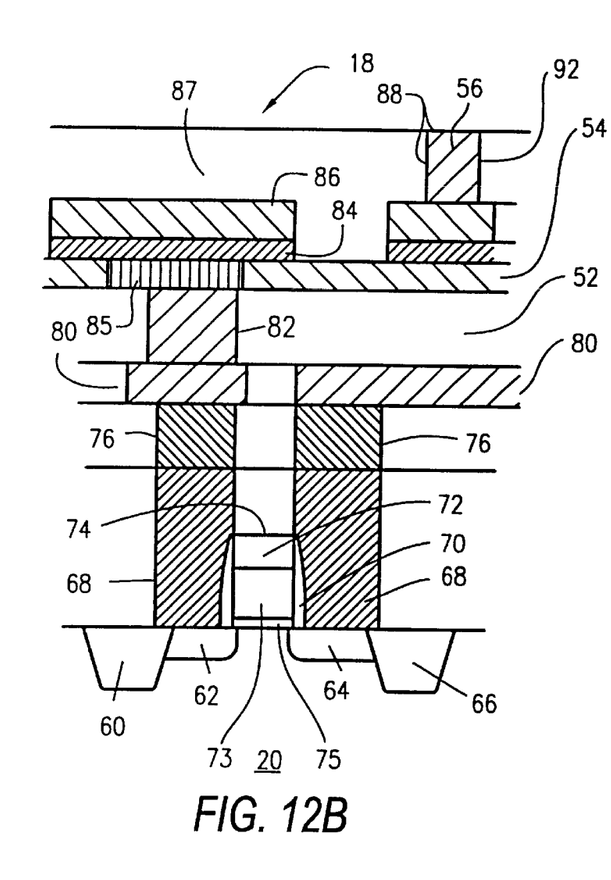
FIG. 12B is a cross-sectional view of a portion of the peripheral circuitry during an eleventh step in the DRAM fabrication.

Referring now to FIGS. 12A and 12B, a protective layer 87 is deposited. Protective layer 87 is preferably formed of an undoped oxide and deposited by CVD to a thickness preferably greater than 2000 angstroms.

Plug openings 60, 88 are formed through the protective layer 87 by photomasking and etching. A layer of conductive material 56 is deposited to provide conductive material within the plug openings 60, 88. An example of the material used to form layer 56 is doped polysilicon. Once deposited, the conductive layer 56 is, for example, dry etched or chemical-mechanical polished to a point just below the upper surface of the protective layer 87 such that the remaining material of the conductive layer 56 forms electrically isolated plugs 57, 92.

Referring now to FIGS. 13A and 13B, a barrier metal layer 59 is deposited and a second metal interconnection layer 58 is then deposited and patterned. Metal interconnection layer 58 is preferably formed of aluminum or the like and deposited by sputtering.

A damascene or other inter-metal backend process then completes the remaining circuit elements, thereby forming the DRAM of the preferred embodiment shown in FIGS. 13A and 13B.

Once completed, the first conductive layer 48 functions as a lower electrode layer for capacitors within the memory cell array 16 and as a first interconnection layer 80 within peripheral circuitry 18. Further, the second conductive layer 54 functions as an upper electrode layer for capacitors within the memory cell array 16 and as a second interconnection layer within the peripheral circuitry 18. Accordingly, the first and second conductive layers 48, 54, when fabricated as detailed above, are able to take the place of the first two metal interconnection layers in the prior semiconductor devices and therefore the fabrication of the memory device of the invention is more efficient and less expensive.

Although the invention has been described with specific reference to DRAM memory circuits, the invention has broader applicability and may be used in any area of semiconductor or electronics fabrication where interconnects are desired between memory storage areas and peripheral circuitry. For example, the preferred embodiment uses the present invention with a Metal Oxide Semiconductor (MOS). The present invention may also be used with a Complementary Metal Oxide Semiconductor (CMOS). For another example, a buried bit-line is used in the preferred embodiment. A bit line which is formed over the capacitor could also be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method of forming a DRAM, said method comprising the steps of:
   providing a memory cell array area and a peripheral circuit area on a semiconductor substrate,
   providing a first conductive layer in said peripheral circuit area and in said memory cell array area,
   patterning said first conductive layer as a capacitor lower electrode in said memory cell array area and as first interconnection layer in said peripheral circuit area,
   providing a dielectric layer over said first conductive layer within said memory cell array area and said peripheral circuit area, wherein at least a portion of said dielectric layer in said memory cell array is comprised of a high K dielectric and at least a portion of said dielectric layer in said peripheral circuit is comprised of a low K dielectric,
   providing a second conductive layer over said dielectric layer, and
   patterning said second conductive layer as a capacitor upper electrode in said memory cell array area and a second interconnection layer in said peripheral circuit area.

2. The method of claim 1, wherein said first conductive layer in said memory cell array area and said first interconnection layer in said peripheral circuit area are deposited simultaneously.

3. The method of claim 2, wherein said first conductive layer in said memory cell array area and said first interconnection layer in said peripheral circuit area are patterned simultaneously.

4. The method of claim 1, wherein said second conductive layer in said memory cell array area and said second interconnection layer in said peripheral circuit area are deposited simultaneously.

5. The method of claim 4, wherein said second conductive layer in said memory cell array area and said second interconnection layer in said peripheral circuit area are patterned simultaneously.

6. The method of claim 1, wherein at least one of said first and second conductive layers is comprised of a conductive oxide.

7. The method of claim 6, wherein said conductive oxide is selected from the group consisting of $RuO_2$ and $IrO_2$.

8. The method of claim 1, wherein at least one of said first and second conductive layers is a material selected from the group consisting of Ru, Ir and $PtSi_2$.

9. The method of claim 1, wherein at least one of said first and second conductive layers is a material selected from the group consisting of $WSi_2$, Al, $Al_2O_3$, Ti, TiN, Pt, and W.

10. The memory device of claim 1, wherein said dielectric layer is a material selected from the group consisting of ST, BST, PZT, SBT, $TaO_5$, $TiO_2$, and $T_2O_3$.

11. A method of electrically connecting a memory cell array to peripheral circuitry within a computer memory system, said method comprising the steps of:
   providing a memory cell array having at least one capacitor including an upper electrode layer and a lower electrode layer,
   providing a peripheral circuit area having first and second interconnection layers, wherein said first interconnection layer is deposited in the same step and formed of the same material as said lower electrode layer and said second interconnection layer is deposited in the same step and formed of the same material as said upper electrode layer,
   providing a first dielectric film between said upper and lower electrode layers, wherein said first dielectric film is comprised of a high K dielectric, and
   providing a second dielectric film between said first and second interconnection layers, wherein said second dielectric film is comprised of a low K dielectric.

12. The method of claim 11, wherein said lower electrode layer in said memory cell array area and said first interconnection layer in said peripheral circuit area are deposited simultaneously.

13. The method of claim 12, wherein said lower electrode layer in said memory cell array area and said first interconnection layer in said peripheral circuit area are patterned simultaneously.

14. The method of claim 11, wherein said upper electrode layer in said memory cell array area and said second interconnection layer in said peripheral circuit area are deposited simultaneously.

15. The method of claim 14, wherein said upper electrode layer in said memory cell array area and said second interconnection layer in said peripheral circuit area are patterned simultaneously.

16. The method of claim 11, wherein at least one of said upper and lower electrode layers is a conductive oxide.

17. The method of claim 16, wherein said conductive oxide is selected from the group consisting of $RuO_2$ and $IrO_2$.

* * * * *

UNITED STATES PATENT AND TRADEMARK OFFICE
CERTIFICATE OF CORRECTION

PATENT NO.    : 6,476,433 B1
DATED         : November 5, 2002
INVENTOR(S)   : Jeff Wu et al.

It is certified that error appears in the above-identified patent and that said Letters Patent is hereby corrected as shown below:

<u>Title page, Item [54] and Column 1, lines 1 and 2,</u>
Should read -- SEMICONDUCTOR MEMORY DEVICE WITH SIMULTANEOUSLY FORMED ELECTRODE AND INTERCONNECTION LAYERS --.

Signed and Sealed this

Twenty-sixth Day of August, 2003

JAMES E. ROGAN
*Director of the United States Patent and Trademark Office*